US012111727B2

(12) United States Patent
Ayyapureddi

(10) Patent No.: US 12,111,727 B2
(45) Date of Patent: *Oct. 8, 2024

(54) APPARATUSES, SYSTEMS, AND METHODS FOR FORCED ERROR CHECK AND SCRUB READOUTS

(71) Applicant: MICRON TECHNOLOGY, INC., Boise, ID (US)

(72) Inventor: Sujeet Ayyapureddi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/167,768

(22) Filed: Feb. 10, 2023

(65) Prior Publication Data

US 2023/0185665 A1    Jun. 15, 2023

Related U.S. Application Data

(63) Continuation of application No. 17/375,957, filed on Jul. 14, 2021, now Pat. No. 11,579,971.

(51) Int. Cl.
*G06F 11/10* (2006.01)
*G11C 11/406* (2006.01)
*G11C 11/4063* (2006.01)

(52) U.S. Cl.
CPC .... *G06F 11/1068* (2013.01); *G11C 11/40615* (2013.01); *G11C 11/4063* (2013.01)

(58) Field of Classification Search
None
See application file for complete search history.

(56) References Cited

U.S. PATENT DOCUMENTS

| | | | | |
|---|---|---|---|---|
| 2016/0307645 A1* | 10/2016 | Kim | ....................... | G11C 29/76 |
| 2017/0060681 A1* | 3/2017 | Halbert | ................... | G06F 3/064 |
| 2017/0139771 A1* | 5/2017 | Chung | ................ | G06F 11/1068 |
| 2021/0141687 A1* | 5/2021 | Song | ....................... | G06F 3/0659 |
| 2021/0141691 A1* | 5/2021 | Song | ................... | G06F 11/1068 |
| 2021/0142848 A1* | 5/2021 | Lim | ........................ | G11C 29/81 |
| 2021/0142860 A1* | 5/2021 | Song | ...................... | G11C 29/44 |
| 2022/0197739 A1* | 6/2022 | Ryu | ...................... | G06F 11/106 |

OTHER PUBLICATIONS

Kim, Jungrae et al. "All-Inclusive ECC: Thorough End-to-End Protection for Rellable Computer Memory"; 2016 ACM/IEEE 43rd Annual International Symposium on Computer Architecture; Jun. 18-22, 2016; pp. all.
Michel, Holger et al. "Read Back Scrubbing for SRAM FPGAs in Data Processing Unit for Space Instruments"; Jun. 2015 NASA/ESA Conference on Adaptive Hardware and Systems (AHS), Jun. 2015, pp. 1-8.

* cited by examiner

*Primary Examiner* — Daniel F. McMahon
(74) *Attorney, Agent, or Firm* — Dorsey & Whitney LLP

(57) ABSTRACT

A memory may perform a sequence of ECS operations to read a codeword, detect and correct any errors, and write the corrected codeword back to the memory array. An ECS circuit may count errors which are detected, and set a value of one or more ECS registers in a mode register if the count exceeds a threshold filter at the end of the ECS cycle. The memory also includes a forced ECS readout circuit, which responsive to a command, for example from a controller, sets the value(s) in the ECS register(s).

20 Claims, 5 Drawing Sheets

APPARATUSES, SYSTEMS, AND METHODS FOR FORCED ERROR CHECK AND SCRUB READOUTS

CROSS-REFERENCE TO RELATED APPLICATION

This application is a continuation of U.S. patent application Ser. No. 17/375,957, filed Jul. 14, 2021. This application is incorporated by reference herein in its entirety and for all purposes.

BACKGROUND

This disclosure relates generally to semiconductor devices, such as semiconductor memory devices. The semiconductor memory device may include a number of memory cells which are used to store information. The stored information may be encoded as binary data, and each memory cell may store a single bit of the information. Information may decay or change in the memory cells due to a variety of different errors, which may lead to one or more bits of incorrect information (e.g., bits with different states that the bit which was originally written) being read out from the memory device.

There may be many applications where it is useful to ensure a high fidelity of information read out from the memory. Memory devices may include error correction circuits, which may be used to determine if the information read out of the memory cells contains any errors compared to the data written into the memory cells, and may correct discovered errors. The memory device may periodically use the error correction circuits to repair errors in information stored within the memory array by scanning every memory cell of the memory array. The device may present information about the number of errors which were corrected after scanning every memory cell. However, this process may be time consuming and dependent on locating a certain number of errors. It may be useful to be able to generate such information in a controlled fashion.

DETAILED DESCRIPTION

Figure 1:
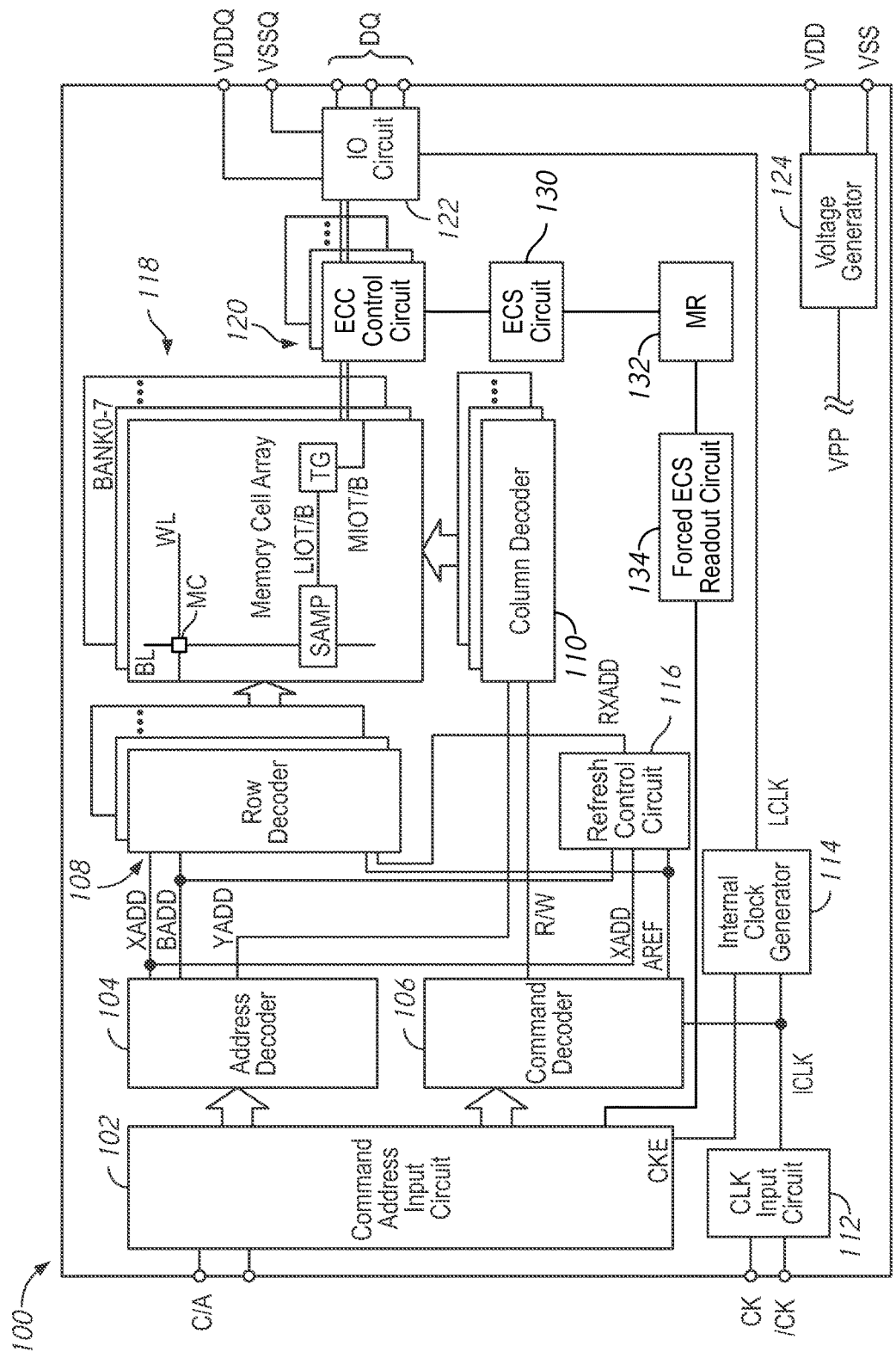
FIG. 1 is a block diagram of a semiconductor device according to some embodiments of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory device may include a memory array which has a number of memory cells, each located at the intersection of a word line (row) and digit line (column). During a read or write operation, a row may be activated, and data may be read from, or written to, the memory cells along the activated row. Each row may include memory cells which store a number of bits of data and a number of bits of parity information (e.g., data bits and parity bits), which may be used to correct up to a certain number of errors in the data bits. For example, a row may include a codeword, which includes M data bits and K parity bits, which may be used to correct up to one of the M data bits or one of the K parity bits. During a write operation the parity bits may be generated by an error correction code (ECC) circuit based on the data written to the memory cells of the row. During a read operation the error correction code circuit may use the parity bits to determine if the read data bits are correct, and may correct any errors which are found in the data as it is being provided off the memory device.

The ECC circuit may identify errors in read data and correct the read data before it is provided to data terminals of the memory device. However, the error may remain in the codeword stored in the memory array. The device may perform error check and scrub (ECS) operations to remedy this. In an ECS operation, the address of each codeword of the memory array may be accessed one at a time. The codeword from the current address is read out, an error, if present, is corrected by the ECC circuit, and then the corrected codeword is written back to the memory array. The memory performs an ECS cycle by performing ECS operations on each codeword of the memory by working through a sequence of every codeword address.

The ECS cycle may be performed over a relatively long span of time, by performing the read-correct-write sequence on different addresses at different times (e.g., while the memory is idle). For example, the ECS cycle may take 24 hours to complete. While performing the ECS cycle, the ECS circuit collects information on the number of corrections being performed. For example, the ECS circuit may count a total number of codewords with errors or a total number of rows with at least one error as part of an error count (EC) and/or may count a row with the highest number of errors as part of an errors per row count (EpRC). At the end of the ECS cycle, based on one or more of these counts, readout information may be updated in a mode register. For example, an ECS register of the mode register (e.g., an EC and/or EpRC register) may be updated if the EC and/or EpRC count exceeds a threshold filter. A controller of the memory may check the mode register and take action if the ECS register(s) indicate that the threshold filter has been exceeded. However, there may be some situations, such as testing the controller's response to the ECS register(s), where this is not ideal, as the ECS cycle may be relatively long, and thus it may take a long time for the ECS register(s) to update. Similarly, since the ECS register(s) are only updated if the count(s) exceed a threshold filter, whether or not the ECS register(s) are updated in any given ECS cycle is non-deterministic.

The present disclosure is directed to apparatuses, systems, and methods for forced error check and scrub readouts. The memory receives a command, such as a multi-purpose command (MPC), which forces the ECS mode register to be set to a specified value regardless of the current status of the ECS cycle. In this way, systems which respond to the ECS cycle reporting a number of errors above a threshold may activated quickly, and in a deterministic fashion. For example, as part of a test operation, a controller could provide a MPC which in turn will cause the memory to set the ECS register(s) to indicate that over a threshold number of errors have occurred. The test may involve monitoring the controller's ability to detect and/or respond to the state of the ECS register(s). The use of the controller command may allow the test to be performed relatively rapidly (e.g., without waiting for the entire ECS cycle to be performed) and deterministically, since the command will set the readout in the mode register to indicate at least a threshold number of errors, regardless of how many errors are actually present.

In some embodiments, the command may specify various properties of the readout being set in the memory. For example, the EC register may indicate that total number of codewords with errors is within one of several ranges (e.g., threshold to N, N+1 to M, M+1 to O, etc.), and the controller may specify which range should be indicated by the EC register. In another example, an EpRC register may indicate a row with the most detected codeword errors, and the number of codeword errors detected on that row. In some embodiments, along with the command to set a value of the ECS register(s), the controller may also specify information to write to the ECS register(s), such as a particular row address and number of errors. For example, the controller may write a row address and a number of errors to a mode register, and the MPC may cause the memory to retrieve those values and write them to the EpRC register. In some embodiments, the memory may have pre-defined values (e.g., an EC range, an EpRC address and/or value) which may be set to the ECS register(s). The use of the ECS forced readout logic may be enabled by a setting of the memory, such as a fuse setting and/or a mode register setting, to prevent the memory from overriding the ECS register(s) outside of a testing environment.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL, and a plurality of memory cells MC arranged at intersections of the plurality of word lines WL and the plurality of bit line BL. The selection of the word line WL is performed by a row decoder 108 and the selection of the bit lines BL is performed by a column decoder 110. In the embodiment of FIG. 1, the row decoder 108 includes a respective row decoder for each memory bank and the column decoder 110 includes a respective column decoder for each memory bank. The bit lines BL are coupled to a respective sense amplifier (SAMP). Read data from the bit line BL is amplified by the sense amplifier SAMP, and transferred to read/write amplifiers 120 over complementary local data lines (LIOT/B), transfer gate (TG), and complementary main data lines (MIOT/B) which are coupled to an error correction code (ECC) control circuit 120. Conversely, write data outputted from the ECC control circuit 120 is transferred to the sense amplifier SAMP over the complementary main data lines MIOT/B, the transfer gate TG, and the complementary local data lines LIOT/B, and written in the memory cell MC coupled to the bit line BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, a codeword including read data and read parity bits is read from memory cells in the memory array 118 corresponding to the row address and column address. The read command is received by the command decoder 106, which provides internal commands so that read data from the memory array 118 is provided to the ECC control circuit 120. The ECC control circuit 120 may use the parity bits in the codeword to determine if the codeword includes any errors, and if any errors are detected, may correct them to generate a corrected codeword (e.g., by changing a state of the identified bit(s) which are in error). The corrected codeword is output to outside the device 100 from the data terminals DQ via the input/output circuit 122.

The device 100 may receive an access command which is a write command. When the write command is received, and a bank address, a row address, and a column address are timely supplied as part of the write operation, and write data is supplied through the DQ terminals to the ECC control circuit 120. The write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the ECC control circuit 120. The ECC control circuit 120 may generate a number of parity bits based on the write data, and the write data and the parity bits may be provided as a codeword to the memory array 118 to be written into the memory cells MC.

The ECC control circuit 120 may be used to ensure the fidelity of the data read from a particular group of memory cells to the data written to that group of memory cells. The device 100 may include a number of different ECC control circuits 120, each of which is responsible for a different portion of the memory cells MC of the memory array 118. For example, there may be one or more ECC control circuits 120 for each bank of the memory array 118.

Each ECC control circuit 120 may receive a codeword which includes a certain number of data bits and a certain number of parity bits (e.g., 128 data bits and 8 parity bits). The data bits may be provided from either from the IO circuit 122 or the memory array 118 depending on if it is a read or write operation, and the ECC control circuit 120 uses the parity bits to locate and correct potential errors in the codeword. For example, as part of a write operation an ECC control circuit 120 may receive 128 bits of data from the IO circuit 122 and may generate 8 parity bits based on those 128 data bits to form a codeword with 136 total bits. The codeword may be written to the memory array 118. As part of an example read operation, the ECC control circuit 120 may receive a codeword with 128 data bits and 8 parity bits from the memory cell array 118. The ECC control circuit 120 may generate new parity bits from the 128 data bits, and then compare the new parity bits to the read parity bits in the codeword to generate syndrome bits. The syndrome bits may be used to locate errors in the codeword and the ECC control circuit 120 and may correct them if any are found before supplying the data bits to the IO circuit 122. While various embodiments may be discussed with reference to ECC circuits which use codewords where 8 parity bits are used to find one error in 128 data bits, it should be understood that these are for explanatory purposes only, and that other numbers of data bits, error bits, and parity bits may be used in other example embodiments.

During a read operation, the ECC control circuit 120 checks the codeword and locates and corrects any errors before providing the corrected codeword to the IO circuit 122. Accordingly, if there was an error, it may remain in the codeword stored in the memory array 118 since the correction is made between the memory array 118 and the IO circuit 122. The memory device 100 includes error check and scrub (ECS) logic 130, which is used to correct errors stored within the memory array 118. The ECS circuit 130 generates a sequence of addresses, which cover all the memory cells of the memory array 118. For each address in the sequence, the ECS circuit 130 operates the address decoder 104 and command decoder 106 to perform a read operation on the memory cells of that address, and then instead of providing the corrected codeword off the device 100 as in a normal read, the corrected codeword is written back to the memory array 118. By cycling through a sequence of addresses which includes all memory cells, the ECS circuit 130 may perform an ECS cycle to repair the errors in the memory cells array 118.

The ECS circuit 130 may perform an ECS cycle based on a manual or auto mode. In a manual mode, the ECS circuit 130 may receive a command (e.g., an MPC) and may perform an ECS operation responsive to that command. In an auto mode, the ECS circuit 130 may use internal logic and timing to carry out ECS operation. For example, the ECS circuit 130 may perform ECS operations during refresh operations. The ECS circuit 130 may have a specified time over which to complete the sequence of addresses (e.g., to perform the ECS cycle). For example, the memory device 100 may specify 12, 24, or 48 hours to complete a sequence of ECS operations which includes all memory cells in the memory array 118. The ECS circuit 130 may perform a read, correct, and write ECS operation on each address in the sequence such that the sequence is completed over the course of the specified period. Accordingly, the timing between individual ECS operations may be specified by the total number of codewords in the memory array 118 and the length of time in which the ECS cycle should be performed.

The ECS circuit 130 collects information about the errors which are located. The information may be stored in a mode register 132, so that a controller of the memory device 100 may retrieve readout information about errors in the memory device 100. For example, the ECS circuit 130 may change (e.g., increment) an error count (EC) count value each time a codeword with an error is detected. In some embodiments, the error count (EC) may be changed responsive to each row which includes one or more codeword errors. Whether the EC value represents total codewords or rows with at least one codeword error may be setting of the memory 100 (e.g., based on a setting in the mode register 132) and may be changed between ECS cycles. When all addresses in the sequence are complete, the ECS circuit 130 may write this count value to the mode register 132. In some embodiments, the ECS circuit 130 may only write the count value to the mode register 132 if the EC count value exceeds a threshold filter. In some embodiments, an EC register of the mode register 132 may not store the exact EC count value, but may instead specify a range of the EC count value. For example, a first state of the EC register may indicate that the EC count value was below the threshold, a second state of the EC register may indicate that the EC count value was between the threshold and a second threshold, a third value may indicate the EC count value was within the range of the second threshold and a third threshold, etc.

Another example readout the ECS circuit 130 may generate is errors per row counter (EpRC). This readout may be generated instead of or in addition to the EC readout. As the ECS circuit proceeds, it may generate a row address, and then cycle through column addresses for that row, with each column address specifying one of a number of codewords along the row. The ECS circuit 130 may have an EpRC counter which tracks the maximum number of codewords with errors which are located on a single row address as well as the row address of the row with the maximum number of errors. Once the sequence of addresses is completed, the ECS circuit 130 may write the number of errors and the row address to the ECS register of the mode register 132 if the EpRC count is greater than a threshold filter.

The threshold filter for the EpRC register may be different than the threshold filter for the EC register. In some embodiments, the filters may be settings of the memory.

The memory device 100 includes a forced ECS readout circuit 134. Responsive to a command, the forced ECS readout circuit 134 may update the mode register 132 as if one or more of the ECS count values was over a threshold at the end of the ECS cycle, regardless of the current state of the counters or of where the ECS circuit is in the cycle. The command may be a multi-purpose command (MPC) received from outside the memory device 100 (e.g., through the command address input circuit 102 and/or command decoder 104). In some embodiments, the memory device 100 may include pre-set values which are written to the ECS register(s) responsive to the MPC. For example, the mode register may include other registers which store pre-set ECS values. These values may be written into the ECS register(s) responsive to the MPC command. In some embodiments, a controller may specify additional details which should be written to the mode register 132. For example, the controller may specify a count (or a range) to write to an EC register of the mode register 132 and/or may specify a row address and/or EpRC count value to write to an EpRC register of the mode register 132 by writing these values to registers of the mode register 132. Responsive to the MPC command, the forced ECS readout circuit 134 may read the values the controller wrote to the mode register and set them to the ECS registers.

In some embodiments, the forced ECS readout logic 134 may only be enabled by a setting of the memory device 100 such as a fuse and/or mode register setting. For example, under normal circumstances the only way the ECS portions of the mode register 132 are updated may be via the ECS circuit 130 at the end of an ECS cycle. However, when the ECS forced readout is enabled, then those portions of the mode register 130 may also be updated by the forced ECS readout logic responsive to commands. This may help limit the use of those commands to situations where the memory device 100 is being used for testing.

The device 100 may also receive commands causing it to carry out one or more refresh operations as part of a self-refresh mode. In some embodiments, the self-refresh mode command may be externally issued to the memory device 100. In some embodiments, the self-refresh mode command may be periodically generated by a component of the device. In some embodiments, when an external signal indicates a self-refresh entry command, the refresh signal AREF may also be activated. The refresh signal AREF may be a pulse signal which is activated when the command decoder 106 receives a signal which indicates entry to the self-refresh mode. The refresh signal AREF may be activated once immediately after command input, and thereafter may be cyclically activated at desired internal timing. The refresh signal AREF may be used to control the timing of refresh operations during the self-refresh mode. Thus, refresh operations may continue automatically. A self-refresh exit command may cause the automatic activation of the refresh signal AREF to stop and return to an IDLE state. The refresh signal AREF is supplied to the refresh control circuit 116. The refresh control circuit 116 supplies a refresh row address RXADD to the row decoder 108, which may refresh one or more wordlines WL indicated by the refresh row address RXADD.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
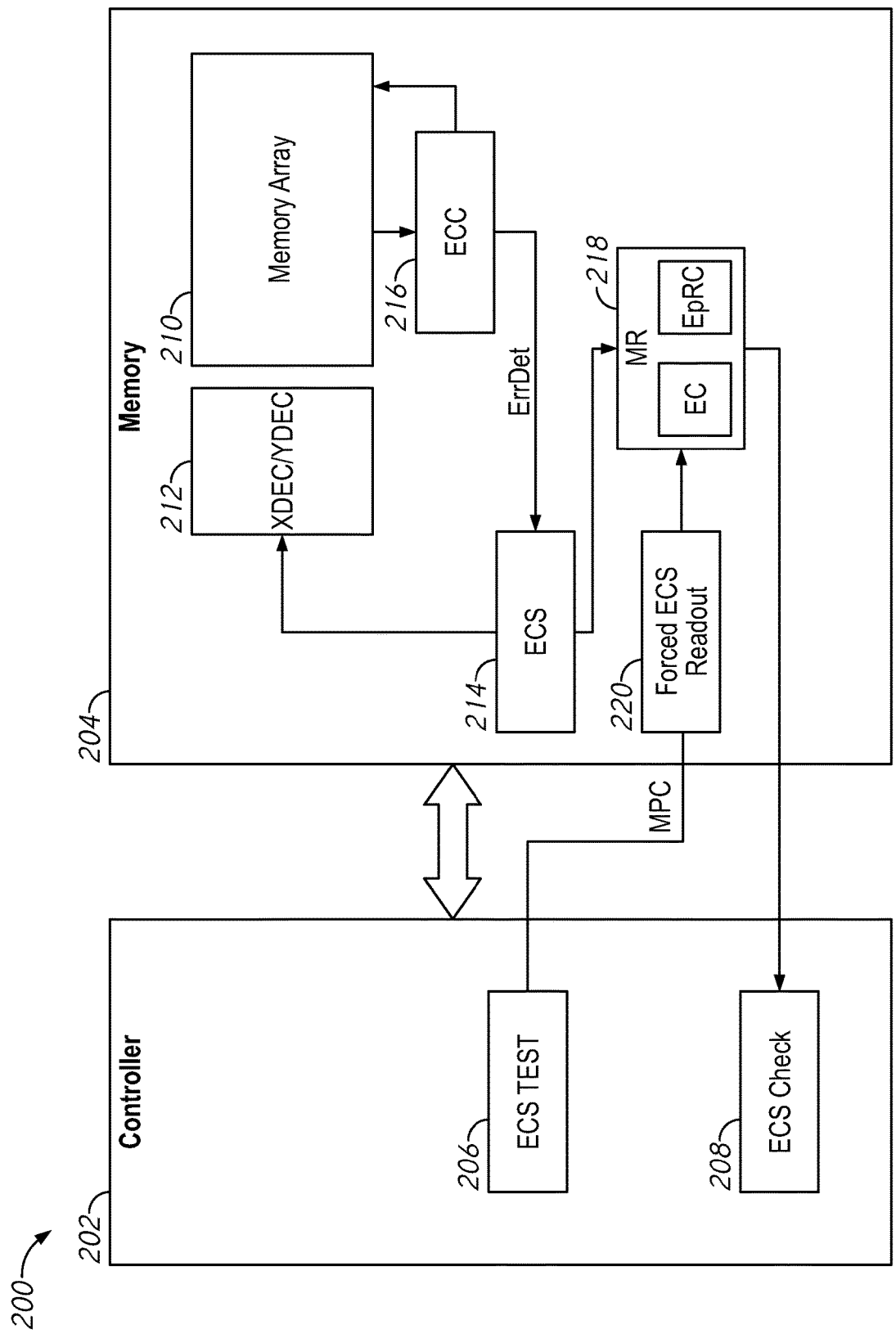
FIG. 2 is a block diagram of a memory system according to some embodiments of the present disclosure.

FIG. 2 is a block diagram of a memory system according to some embodiments of the present disclosure. The system 200 includes a controller 202 and a memory 204. The memory may, in some embodiments, implement the memory device 100 of FIG. 1. The memory system 200 illustrates components which may be used in an example operation where the controller 202 tests its ability to detect and/or respond to different ECS related readouts (e.g., stored in one or more ECS registers) in the mode register 218. To avoid having to wait until the ECS mode registers 218 are updated (e.g., at the end of an ECS sequence, and only if one or more counts exceeds a threshold), the controller 202 may use an ECS test circuit 206 to provide a command, such as an MPC, to a forced ECS readout circuit 220 of the memory 204. The forced ECS readout circuit 220 updates one or more of the ECS registers of the mode register 218 based on the command. ECS check circuits 208 of the controller 202 may then recognize the updated information in the mode register 218 and respond to it.

The controller 202 includes an ECS test circuit 206 which may be used to perform tests on the ECS system of the memory 204. The controller 206 also includes ECS check circuitry 208 which monitors ECS related registers in a mode register 218 of the memory 204. For example, the controller 206 may periodically perform mode register read operations on the memory 204 and the ECS check circuits 208 may receive ECS related values from the memory 204. In some embodiments, the ECS check circuits 208 may represent a normal operation of a controller 202, while the ECS test circuits 206 may be used only for testing purposes. As part of a test operation, the ECS test circuit 206 may provide a command, such as an MPC to the memory 204, and then monitor the response of the ECS check circuit 208. The ECS check circuit 208 may periodically receive updated values from the ECS portion of the mode register 218 (e.g., EC and/or EpRC values). If these values indicate that the number of errors is above a threshold, the ECS check circuit may cause the controller 202 to take various actions. For example, the controller 202 may flag that the memory 204 has too many errors, may take various corrective actions etc. As part of the test operation, after providing the command to the memory 204, the ECS test circuits 206 may monitor the response of the ECS check circuits 208 (and/or other components of the controller 202) to ensure a proper response to a greater than threshold number of errors being detected in the mode register 218.

Along with the command, the ECS test circuit 206 may provide information which specifies what values should be set to the ECS registers of the mode register 218 (e.g., the EC and/or EpRC registers). In some embodiments, the ECS test circuit 206 may provide the information as part of the command. In some embodiments, the ECS test circuit 206 may write the specified values to the memory (e.g., to the mode register 218) either along with the command or separately. The command (e.g., the MPC) causes the ECS forced readout circuit 220 to write the values provided by the controller to the ECS registers. For example, if the EC register has a set of values which represent different ranges, the ECS test circuit 206 may send a value (e.g., which range of counts) to the mode register 218. Similarly, an example MPC directed to the EpRC register, the ECS test circuit 206 may have written a count value and/or a row address to the mode register 218 which should be set to that the EpRC register by the ECS forced readout circuit 220. In some embodiments, rather than the controller 202 providing the values, they may be pre-set in the memory 204.

The ECS check circuits 208 may cause the controller 202 to take one or more actions based on the values read from the ECS register(s) of the mode register 218. For example, if the EC register indicates that more than a threshold number of errors have been counted in the most recent ECS cycle, the controller 202 may identify the memory 204 as defective. The memory 204 may be flagged by the controller 202, which may notify users that repair or further testing is required. The controller 202 may also, for example, shift critical information to memory modules which are not identified as defective. If the EpRC register indicates that more than a threshold number of errors is present on an identified row (e.g., based on the row address stored in the EpRC register), the controller 202 may identify that row as defective. The EpRC may take various steps to mitigate damage, for example by moving data off the defective row, by performing a post package repair operation, etc.

The memory 204 includes an ECS circuit 214 which, as part of an ECS cycle, generates addresses from a sequence of addresses. For example, the ECS circuit 214 may provide a row and column address, and then update (e.g., increment) the column address, and continue until all column addresses have been provided, the ECS circuit 214 may then update (e.g., increment) the row address and repeat the process. Once all address combinations for a given bank have been provided (e.g., a final row and column address are provided), a bank address may be updated (e.g., incremented). The ECS circuit may continue generating addresses until addresses associated with all memory cells have been provided over the course of an ECS cycle. The current address may be provided to row and column decoders 212, along with commands (not shown) such that for each address, the codeword associated with the current address is read out to the ECC circuit 216, corrected (if necessary), and the corrected codeword written back to the location specified by the current address. The address may then be updated.

The ECC circuit 216 may provide an error detected signal ErrDet to the ECS circuit 214. The signal ErrDet may be active each time the ECC circuit 216 detects an error in the codeword read from the memory array 210. The ECS circuit includes one or more counters which are updated (e.g., incremented) responsive to the ErrDet signal. For example, an EC counter may be updated based on each time the ErrDet signal is active, while the EpRC counter may also take into account the current address being provided by the ECS circuit 214 in order to count the maximum number of errors per row. If a counter exceeds a threshold value at the end of an ECS cycle, then the ECS circuit 214 may write information based on the count value to the mode register 218. The different values tracked by the ECS circuit 214 may have different thresholds (e.g., an EC threshold and an EpRC threshold). The thresholds may be settings of the memory (e.g., fuse settings and/or mode register settings) and may be set based on customer requirements.

The mode register 218 may store various values which are related to the ECS operation. For example, the present disclosure describes an EC register and an EpRC register, although different, more, or fewer registers are possible in other examples. Each register may store various values associated with a respective counter in the ECS circuit 214. For example, the EC register may represent a number of codewords with errors which were detected in the previous ECS cycle. The EC register may represent a raw count value, or may represent a range in which the count value falls. For example, a first value of the EC register may represent that the count is below the threshold, a second value of the EC register may represent that the count is between the threshold and a first count value, a third value of the EC register may represent that the count is between the first count value and a second count value etc. The EpRC register may store both a count value and a row address associated with the row which contained the most codeword errors.

Figure 3:
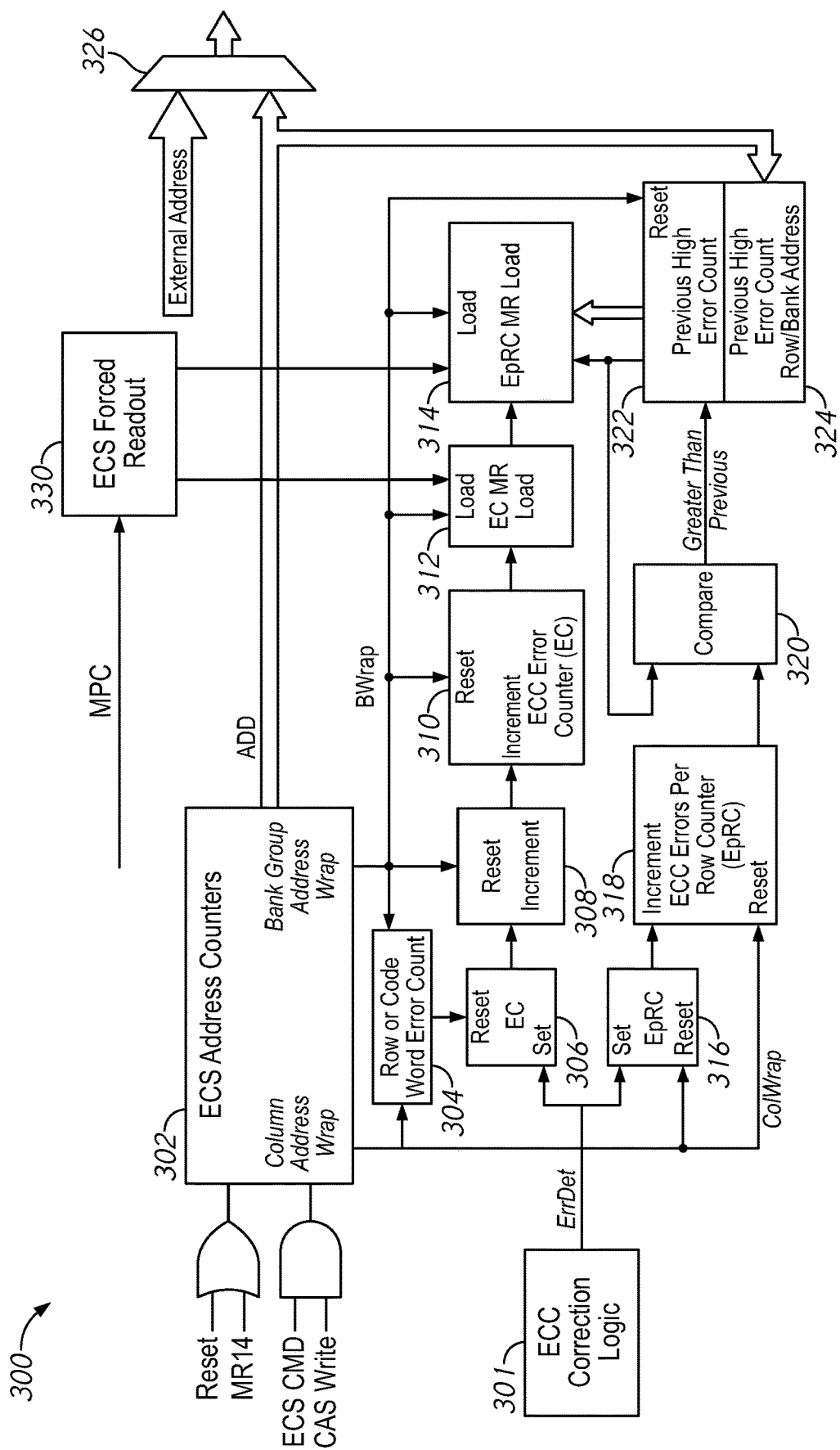
FIG. 3 is a block diagram of ECS circuit according to some embodiments of the present disclosure.

FIG. 3 is a block diagram of ECS circuit according to some embodiments of the present disclosure. FIG. 3 shows the ECS circuit 300 along with other components such as the ECC circuit 301 (e.g., 120 of FIG. 1 and/or 216 of FIG. 2) and ECS forced readout logic 330 (e.g., 134 of FIG. 1 and/or 220 of FIG. 2). The ECS circuit 300 may, in some embodiments, be included in the ECS circuit 130 of FIG. 1 and/or 214 of FIG. 2.

The ECS circuit 300 includes ECS address counters 302. The ECS address counters 302 generate a current address ADD, which may include a row address XADD, column address YADD, and/or bank address BADD. The current address may be provided through a multiplexer 326 to address decoder(s) (e.g., 104, 108, and/or 110 of FIG. 1), which in turn may read a codeword specified by the address ADD out to the ECC circuit 301. The ECC circuit may determine if the codeword contains an error, repair it, and write the corrected codeword back to memory array. If an error is detected, the ECC circuit 301 provides the signal ErrDet at an active level. The ECS address counters 302 may then update the addresses ADD responsive to a next ECS operation. The ECS circuit 300 includes an EC error counter 310, and an EpRC error counter 318, each of which may increment responsive to the ErrDet signal being active. Various logic circuits (e.g., 304-308, 316, and 322-324) may control the behavior of how the counters 310 and 318 are updated, as described in more detail herein. An EC register load logic circuit 312 may determine if the count value stored in the EC error counter 310 exceeds a threshold when an ECS cycle completes. Based on that comparison, the EC register load logic circuit 312 may update a value of an EC register in a mode register (e.g., 218 of FIG. 2). Similarly, EpRC register load circuit 314 may compare the count from the EpRC error counter 318 to a threshold and may update the value of an EpRC register accordingly. The ECS forced readout logic 330 may receive a command MPC, and may instruct either (or both) of the register load circuits 312 and 314 to update their respective register accordingly.

The ECS address counters 302 include a set of counters which determine a current value of the addresses ADD. For example, the ECS address counters 302 may include a row address counter, a column address counter, and a bank address counter, each of which determines a value of a row, column, and bank address in the current address ADD. A reset signal Reset or a mode register command (in this example stored in mode register 14 MR14), the reset the address counters to an initial value. When an ECS command signal ECS CMD is active, indicating an ECS mode, and a write signal CAS Write is active (indicating that the previous ECS operation was just completed), the ECS address counters 302 updates a value of the addresses ADD by changing one or more of the internal counters. The values of the address counters may reset when a maximum value is reached. When a counter wraps, it may cause another counter to change (e.g., increment), and may also cause a wrap signal to be provided.

Figure 4:
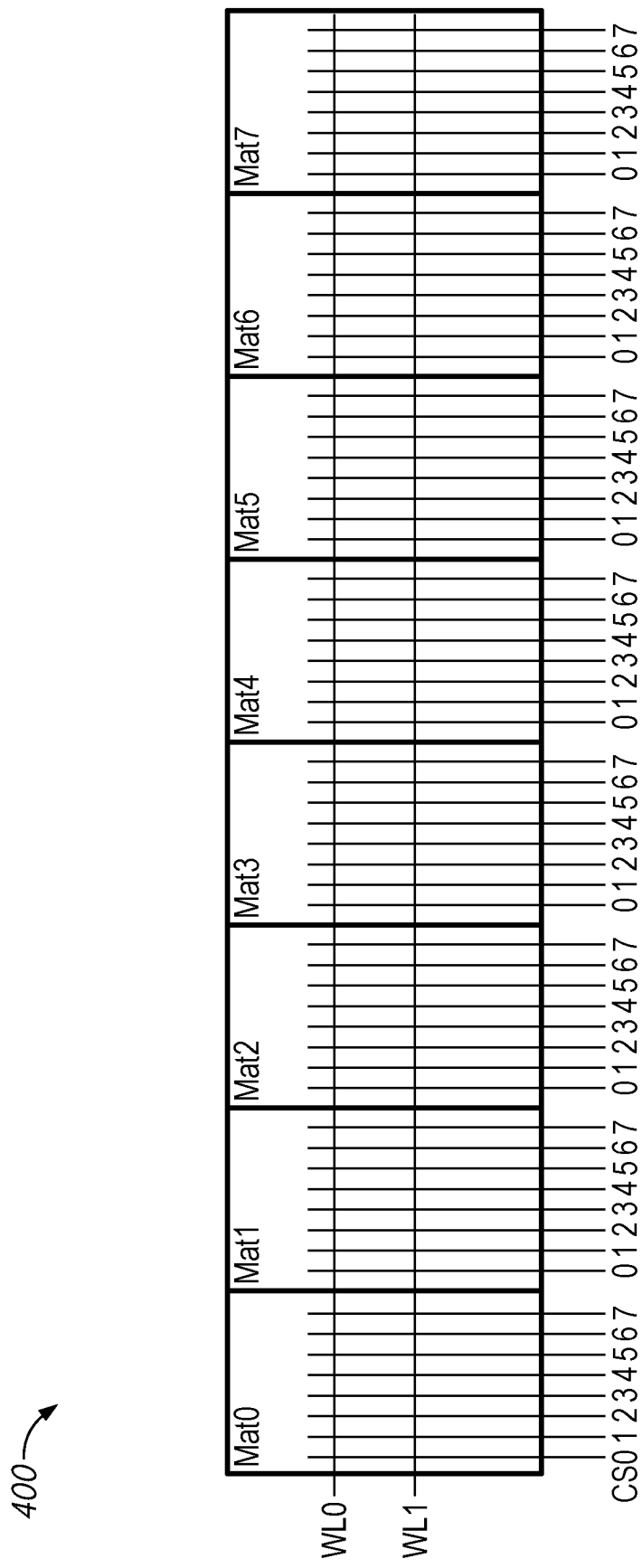
FIG. 4 is a block diagram of an example memory bank according to some embodiments of the present disclosure.

For example, responsive to an update, the ECS Address counters 302 may update a column address while keeping the row and bank address the same. When the column address reaches its maximum value (e.g., all the columns on the current row have had an ECS operation performed on them), the column counter may reset (to an initial column address), the column wrap signal ColWrap may be provided, and the row address value may be updated (e.g., incremented). When the row address reaches its maximum value, the row address may wrap back to the initial value, and the bank address may be updated. When the bank address wraps, a bank address wrap signal BWrap is provided to indicate that the ECS cycle has completed. FIG. 4 describes an example of address updates and wrapping in more detail.

The multiplexer 326 provides the address ADD generated by the ECS address counters 302 or an external address. The multiplexer 326 may be controlled (by a signal not shown) to determine whether the addresses ADD used as part of an ECS operation are provided to the decoders or if an external address (e.g., as part of an access operation, a refresh operation etc.) is provided instead.

In an EC path, a latch 306 holds an EC update signal. A set terminal is coupled to the error detect signal ErrDet. When ErrDet is active (e.g., when the ECC circuit 301 detects an error in the current codeword), the value of the EC update signal is set to 1. A reset terminal of the latch 306 is coupled to a selector circuit 304. The selector circuit 304 determines a mode for the EC counter. In a first mode, the EC counter may represent a total number of codeword errors, and the signal BWrap is passed to the reset terminal of the latch 306, so that its value resets each time an ECS cycle completes. In a second mode, the EC counter may represent a total number of rows which include at least one error, and the selector 304 may pass the signal ColWrap to the reset terminal of the latch 306. Accordingly, the latch 306 may reset each time a row address is changed.

A counter 308 receives the update signal from the latch 306 and increments a counter each time the value of the EC update signal changes to 1. The counter 308 is reset by the signal BWrap to ensure that the overall value of EC is determined on an ECS cycle by ECS cycle basis. The value from the counter 308 is provided to an EC counter 310, which controls the EC count value. The EC count value is incremented each time the counter 308 increments. Accordingly, in the first mode, the EC count value is incremented each time ErrDet is active. In the second mode, the EC count value is incremented once per row if any address along that row (e.g., any value of the column address for a given row and bank address) causes the signal ErrDet to be active.

The EC counter 310 provides the EC count value to the EC mode register load logic 312. The EC mode register load logic 312 has a load terminal coupled to the signal BWrap. When the signal BWrap is active (e.g., indicating the end of the ECS cycle), the EC mode register load logic compares the EC count value to a threshold, and writes a value to a mode register based on that comparison.

In an EpRC path, a latch 316 has a set terminal coupled to ErrDet. When ErrDet is active, an EpRC update signal becomes active and an activation is provided to the EpRC counter 318. The latch 316 has a reset terminal coupled to the signal ColWrap. Accordingly, when the column address wraps (e.g., when a given row is complete), the value in the latch 316 is reset to an inactive level (e.g., 0). In this way, the latch 316 provides an active signal each time ErrDet is active, but resets after each row is complete. An EpRC counter 318 increments an EpRC count value each time an activation is provided by the latch 316 (e.g., each time ErrDet is active on a given row). The EpRC counter circuit 318 has a reset terminal coupled to the signal ColWrap, such that the EpRC count value resets each time ECS operations on a given row are complete.

The EpRC count value is provided to a comparator 320, which compares the current EpRC count value to a stored EpRC count value in register 322. If the current EpRC count is greater, it is written over the stored EpRC count value and stored in register 322. When a new value is stored as the stored EpRC count value in register 322, a row and bank address portion of ADD is also stored in register 324. The registers 322 and 324 are reset by the signal BWrap, indicating that an ECS cycle has completed.

The EpRC mode register load logic 314 has a load terminal coupled to BWrap. Responsive to BWrap being active, the load logic 314 reads the values in the registers 322 and 324. The EpRC mode register 314 compares the values to a threshold and writes the EpRC count value and row and bank address stored in the addresses 322 and 324 into the EpRC mode register. In some embodiments, the EpRC load logic 314 may also check the EC load logic 312 to determine if the EC count value is over the threshold, and may only load the EpRC count value (and addresses) if the EC count value is over the threshold.

FIG. 4 is a block diagram of an example memory bank according to some embodiments of the present disclosure. The memory bank 400 may, in some embodiments, be included in the memory array 118 of FIG. 1 and/or 210 of FIG. 2.

The memory bank 400 is divided into a number of memory mats, each of which includes a number of memory cells organized at the intersection of word lines WL and bit lines. The bit lines are grouped together in column select CS lines, each of which include some number of bit lines (e.g., 2, 4, 8, 16, etc.) bit lines which are accessed by a common column select address. For the sake of illustration, 8 column select groups, represented as column select lines (labelled 0 to 7), per memory mat and two word lines WL0 and WL1 are shown, however more or fewer may be used in other example embodiments.

During an ECS operation, a bank address specifying bank 400 along with a row address and column address are provided. For example, during a first ECS operation the row address may specify WL0 while the column address may specify CS0. Bits will be read out from the CS0's in each of the memory mats to form a codeword. On the next ECS operation, the column address will update to CS1, and bits will be read from the intersection of each CS1 with the WL1 in each mat. When the ECS address counter reaches WL0 and CS7, on the next ECS operation, the column address will wrap back to CS0, and the row address will update to WL0.

Figure 5:
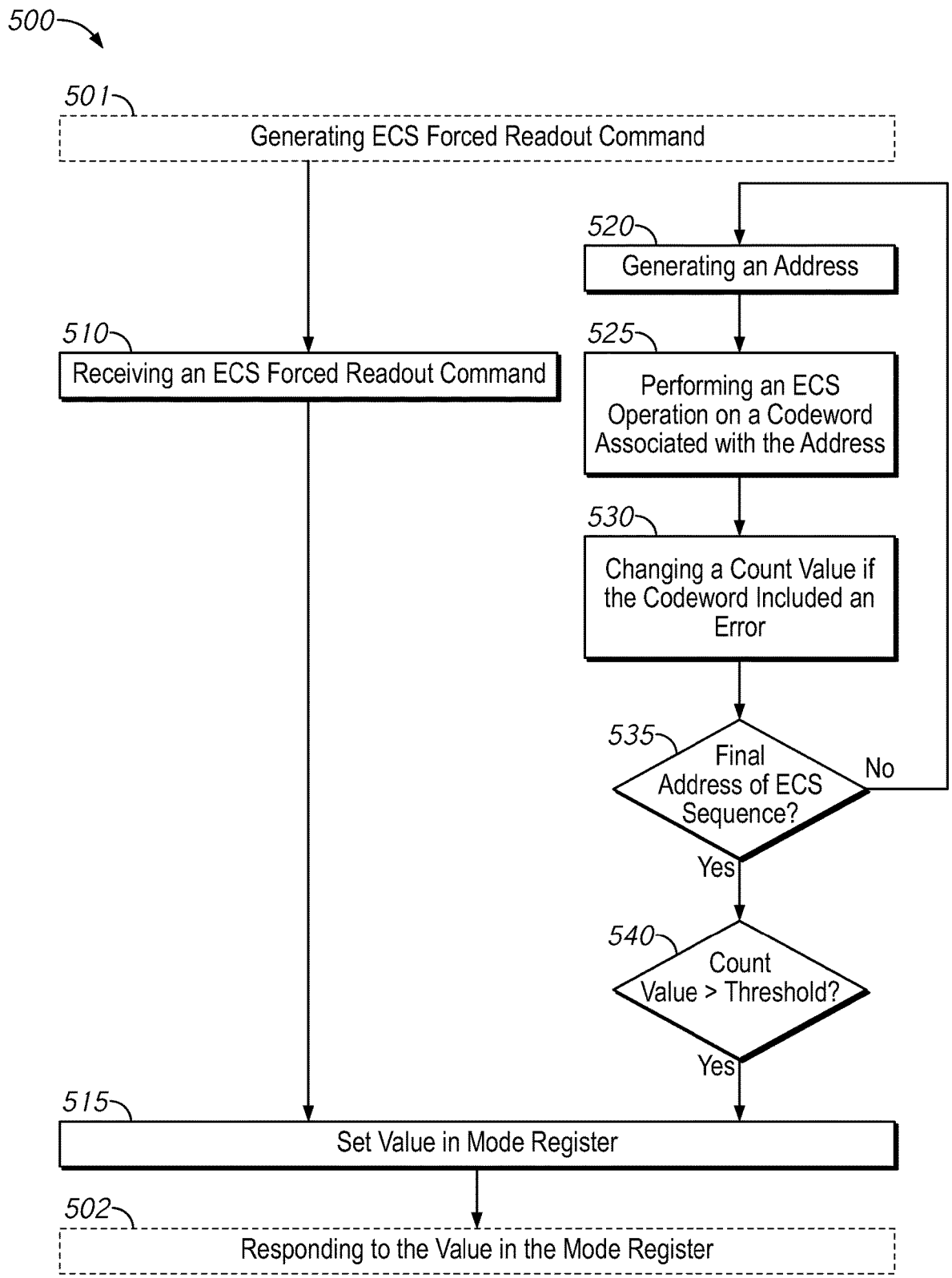
FIG. 5 is a block diagram of a method according to some embodiments of the present disclosure.

FIG. 5 is a block diagram of a method according to some embodiments of the present disclosure. The method 500 may, in some embodiments, be implemented by one or more of the apparatuses and/or systems described in FIGS. 1-4. The method 500 may include some steps performed by a controller (e.g., 202 of FIG. 2) which are shown in dotted line boxes. The steps in the sold line boxes may be performed by a memory.

The method 500 includes optional box 501, which describes generating an ECS forced readout command. The ECS forced readout command may be generated by an ECS test circuit (e.g., 206 of FIG. 2) of the controller. The ECS forced readout command may, in some embodiments, be an MPC. The ECS forced readout command may be generated as part of a test operation. In some embodiments, the method 500 may include writing ECS register values to the memory (for example to non-ECS registers). These values may be subsequently loaded into the ECS registers responsive to the ECS forced readout command. The values may be provided along with the command or may be provided separately.

The method 500 includes box 510, which describes receiving an ECS forced readout command. The ECS forced readout command may be received at an ECS forced readout circuit (e.g., 134, 220, and/or 330 of FIGS. 1-3). The method 500 includes box 515, which describes setting a value in a mode register. The value in the mode register may be set responsive to the received ECS forced readout command. For example, the method 500 may include setting a value of an EC register based on an EC count (or value) specified in a register of the mode register. The value may be a pre-set value or may be specified by the controller. The method 500 may include setting a value of an EpRC register based on a EpRC count (or value) and a row address specified in the mode register. The value and row address may be a pre-set value or may be specified by the controller.

The method 500 includes optional box 502, which describes responding to the value in the mode register. For example, an ECS check circuit (e.g., 208) of the controller may read the ECS register values, such as the values in the EC and/or EpRC registers. Based on the result, the controller may take one or more actions. For example, if the EC register value indicates a greater than threshold number of errors, then the ECS check circuit may instruct the controller to identify the memory as defective. The controller may take various corrective actions such as transferring data to other memory modules. For example, if the EpRC register value indicates that a row has greater than a threshold number of errors, the controller may identify the row address stored in the EpRC register as defective. The controller may take various corrective actions such as moving data off that row and/or performing a repair operation such as a post-package repair operation.

The method 500 may also optionally include blocks 520 to 540 which describe the steps of an ECS cycle. The method 500 may include entering the memory into an auto-ECS mode, where the memory periodically performs ECS cycles over a selected span of time (e.g., over the course of 24 hours). Block 520 describes generating an address. The address may be generated by ECS address counters (e.g., 302 of FIG. 3). The address may be from a sequence of addresses and may include a row address, a column address, and a bank address. Each time the address is generated (e.g., each time box 520 is repeated), then the column address may be changed (e.g., incremented) until the column address wraps, at which point the row address may be changed (e.g., incremented). When the row address wraps, a bank address may be changed (e.g., incremented). When the bank address wraps, the ECS cycle may be complete.

Block 525 describes performing an ECS operation on a codeword associated with the address. The ECS operation includes reading the codeword from the memory to an ECC circuit, correcting an error (if present), and writing the corrected codeword back to the memory array (at the location specified by the address).

Block 530 describes changing a count value if the codeword included an error. For example, an EC count value may be updated (e.g., incremented) each time a codeword is detected as including an error, or each time a row includes a codeword with an error. The block 530 may include updating an EpRC count value each time a codeword along a row is detected as including an error. The block 530 may include comparing the EpRC count value to a stored EpRC value, and replacing the stored EpRC value with the EpRC count value if the EpRC count value is greater than the stored EpRC value.

Block 535 describes determining if the address is the final address of the ECS sequence. For example, a bank address wrap signal may indicate if the current address is the final address or not. If not, the ECS cycle may return to block 520. If so, then ECS cycle may proceed to block 540. Block 540 describes comparing the count value (or the stored EpRC value) to a threshold filter. If the count value is greater than the threshold, then block 515 (as previously described) may be used to set value(s) of the ECS register(s) in the mode register.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
an error check and scrub (ECS) register configured to store a value;
an ECS circuit configured to set the value of the ECS register based at least in part on a count value, the count value indicative of a number of times an error is detected in a memory array of a memory; and
an ECS readout circuit configured to set the value of the ECS register to a value that indicates at least a threshold number of errors based at least in part on an external command, wherein the value is set regardless of the count value.

2. The apparatus of claim 1, wherein the ECS readout circuit sets the value of the ECS register based at least in part on the external command independent of a status of an ECS cycle.

3. The apparatus of claim 1, wherein the ECS readout circuit is enabled by a setting of the memory, comprising a fuse setting, or a mode register setting, or a combination thereof.

4. The apparatus of claim 1, wherein the ECS register includes an errors per row count (EpRC) register, wherein the ECS circuit is configured to increment the count value each time the ECS circuit detects an error along a current row, compare the count value to a stored count value, and replace the stored count value responsive to the count value being greater than the stored count value, and wherein the ECS circuit is configured to set the EpRC register based on the count value exceeding a threshold.

5. The apparatus of claim 1, wherein the ECS circuit is configured to set the value if the count exceeds a threshold filter at the end of an ECS cycle.

6. The apparatus of claim 1, wherein the apparatus stores pre-set values at least a selected one of which is written to the ECS register responsive to the external command.

7. A system comprising:
a controller configured to provide a multi-purpose command; and
a memory configured to receive the multi-purpose command, the memory comprising:
an error check and scrub (ECS) readout circuit configured to set a value of an ECS register based at least in part on the multi-purpose command, wherein the value is set regardless of a status of an ECS cycle.

8. The system of claim 7, wherein the value that is set at the ECS register indicates at least a threshold number of errors, regardless of a number of errors actually present in the memory.

9. The system of claim 8, wherein the controller is configured to identify the memory as defective based at least in part on the value that is set at the ECS register indicating at least the threshold number of errors.

10. The system of claim 9, wherein the controller is configured to shift critical information to memory modules of the memory which are not identified as defective.

11. The system of claim 7, wherein the controller provides a count to write to the ECS register, or an errors per row counter (EpRC) count value to write to an EpRC register, or a combination thereof.

12. The system of claim 7, wherein ECS readout circuit is enabled by a setting of the memory, comprising a fuse setting, or a mode register setting, or a combination thereof.

13. The system of claim 7, further comprising:
an ECS circuit configured to set the value of the ECS register based at least in part on a count value, the count value indicative of a number of times an error is detected in a memory array.

14. The system of claim 13, wherein the ECS circuit is configured to set the value if the count exceeds a threshold filter at the end of the ECS cycle.

15. The system of claim 7, wherein the memory stores pre-set values a selected one of which is written to the ECS register responsive to the multi-purpose command.

16. A method comprising:
providing a multi-purpose command to a memory; and
forcing an update of a register value of an error check and scrub (ECS) register based at least in part on the multi-purpose command, the forcing of the update of the register value occurring regardless of a status of an ECS cycle.

17. The method of claim 16, wherein the register value is an errors per row count (EpRC) register.

18. The method of claim 16, further comprising:
providing a count to write to the ECS register, or an errors per row counter (EpRC) count value to write to an EpRC register, or a combination thereof.

19. The method of claim 16, further comprising:
generating an address from a sequence of addresses;
performing an ECS operation on a codeword stored in a location of a memory array specified by the address;
changing a count value if the codeword included an error;
determining if the count value is greater than a threshold responsive to the address being a final address in the sequence of addresses; and
setting the ECS register responsive to the count value being greater than the threshold.

20. The method of claim 16, wherein providing the multi-purpose command is a part of a test operation for testing the controller response to the ECS register.

* * * * *